(12) United States Patent
Lee

(10) Patent No.: US 7,983,288 B2
(45) Date of Patent: Jul. 19, 2011

(54) DATA TRANSMISSION LINE OF SEMICONDUCTOR MEMORY DEVICE

(75) Inventor: Hyun Woo Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 2044 days.

(21) Appl. No.: 10/964,346

(22) Filed: Oct. 13, 2004

(65) Prior Publication Data

US 2005/0271085 A1    Dec. 8, 2005

(30) Foreign Application Priority Data

Apr. 28, 2004    (KR) .................. 10-2004-0029603

(51) Int. Cl.
*H04L 12/28*    (2006.01)
(52) U.S. Cl. .................... 370/419; 365/189.02; 365/233
(58) Field of Classification Search .................. 370/280, 370/435, 522, 201, 293, 294, 321, 352, 542, 370/329, 449, 350; 365/189.05, 189.14, 365/221, 201, 230.08, 230.04, 185.03, 193, 189.12; 714/710, 764, 805

See application file for complete search history.

(56) References Cited

U.S. PATENT DOCUMENTS

| | | | | |
|---|---|---|---|---|
| 4,980,887 | A * | 12/1990 | Dively et al. | 714/713 |
| 5,881,009 | A * | 3/1999 | Tomita | 365/221 |
| 6,008,084 | A * | 12/1999 | Sung | 438/241 |
| 6,421,267 | B1 * | 7/2002 | Kuo et al. | 365/63 |
| 6,920,068 | B2 * | 7/2005 | Ku | 365/189.02 |
| 7,002,253 | B2 * | 2/2006 | Katsura et al. | 257/758 |
| 7,239,174 | B2 * | 7/2007 | Madurawe | 326/38 |
| 2001/0043507 | A1 * | 11/2001 | Ooishi | 365/233 |

FOREIGN PATENT DOCUMENTS

KR    2001 0016800    3/2001

* cited by examiner

*Primary Examiner* — Michael J Moore, Jr.
(74) *Attorney, Agent, or Firm* — Ladas & Parry LLP

(57) ABSTRACT

Disclosed are a data transmission line and a repeater connected to the data transmission line of a semiconductor memory device. The data transmission line includes the repeater capable of transmitting control signals related to even data or odd data in a DDR DRAM, so the number of transmission units used in the data transmission lines is reduced, thereby improving the data transmission speed.

3 Claims, 9 Drawing Sheets

DATA TRANSMISSION LINE OF SEMICONDUCTOR MEMORY DEVICE

BACKGROUND OF THE INVENTION

1. Field of the Invention

The present invention relates to a data transmission line of a semiconductor memory device, and more particularly to a data transmission line of a semiconductor memory device, which can be effectively aligned while optimizing a structure of a repeater connected to the data transmission line.

2. Description of the Prior Art

Recently, as semiconductor devices have been highly integrated, a line width of a circuit is gradually reduced and a line length of the circuit is gradually enlarged.

That is, as high-integration semiconductor memory devices having capacity of 1 G to 4 G have been developed, a data transmission line of a semiconductor device becomes long. For instance, a data transmission line having a length more than 2 cm can be provided for a memory device having capacity above 1 G. Such a long data transmission line may cause an increase of loading capacitance, which is one of resistance factors, thereby significantly lowering a data transmission speed.

FIG. 1 is a schematic view showing an alignment of conventional data transmission lines (GIO_0 to GIO_N). The data transmission lines shown in FIG. 1 may cause signal distortion due to parasitic capacitance created between data transmission lines. In addition, the data transmission speed may be lowered due to a coupling effect generated between neighbor data transmission lines.

In order to solve the above problem, there has been suggested a shielding line, such as a ground line, aligned between data transmission lines. A data transmission line structure including the shielding line can prevent the coupling effect from being generated between data transmission lines, but may cause an increase of load in the data transmission lines so that the data transmission speed becomes lowered.

FIG. 2 is a schematic view showing an alignment of another conventional data transmission lines including a shielding line is aligned between data transmission lines.

As shown in FIG. 2, a shielding line, that is, a ground line is aligned between data transmission lines in order to shield the coupling effect created between data transmission lines. However, the data transmission lines shown in FIG. 2 cannot prevent an increase of load applied to the data transmission lines, so that the data transmission speed may be lowered.

For this reason, there has been suggested an advanced technique employing a repeater for preventing the data transmission speed from being lowered due to an increase of load applied to the transmission lines.

FIG. 3 shows a conventional repeater connected to a data transmission line.

In FIG. 3, GIO_0_L, GIO_0_R, GIO_1_L and GIO_1_R represent data transmission lines used for DDR SDRAM. For instance, GIO_0_L and GIO_0_R represent odd data transmission lines. In addition, GIO_1_L and GIO_1_R represent even data transmission lines.

A control signal (RD_Direction) is enabled during a read operation and a control signal (/RD_Direction) is enabled during a write operation.

If control signal (RD_Direction) is enabled with a high level during the read operation, data of data transmission lines (GIO_0_L and GIO_1_L) are transferred to data transmission lines (GIO_0_R and GIO_1_R) by passing through a repeater including two inverters.

In contrast, control signal (/RD_Direction) is enabled with a high level during the write operation, so that data of data transmission lines (GIO_0_R and GIO_1_R) are transferred to data transmission lines (GIO_0_L and GIO_1_L) by passing through a repeater including two inverters.

FIG. 4 is a schematic view illustrating a structure of a data transmission path of transmission data in a conventional DDR SDRAM employing the repeater as shown in FIG. 3, wherein a data transmission scheme of 4-bit prefetch structure is illustrated.

In FIG. 4, repeaters 401 and 402 include the repeater shown in FIG. 3 as an internal circuit thereof. Repeaters 403 and 404 are identical to the repeater shown in FIG. 3. The repeaters 401, 402, 403 and 404 are connected to a pipe latch unit 410 through data transmission lines (gio_q0_r, gio_q1_r, gio_q2_r, and gio_q3_r). The pipe latch unit 410 includes a plurality of switches 41, 42, 43, and 44. The switches 42 and 44 have a data latch function.

During an operation of the DDR SDRAM, data (DQ0, DQ1, DQ2, and DQ3) transmitted through data transmission lines (gio_q0_l, gio_q1_l, gio_q2_l, and gio_q3_l) connected to the repeater become even data or odd data according to a logic value of column addresses (A<1> and A<0>). Hereinafter, the column address (A<1> and A<0>) is referred to as a "start address". For reference, data (DQ0, DQ1, DQ2, and DQ3) used in the present invention represent input/output data, which can be continuously inputted/outputted when a burst length is 4.

As generally known in the art, read/write operations of the DDR SDRAM are classified into an even data operation and an odd data operation according to the start address. That is, the data transmission path may vary according to the start address (A<1> and A<0>) of a column address signal applied to the DDR SDRAM from a chip-set. For instance, if the start address (A<1> and A<0>) is "00" or "10", the even operation is performed. In addition, the odd operation is performed if the start address is "01" or "11".

In general, the even operation or the odd operation is not specially determined during the write operation for storing data. However, the even operation or the odd operation will be determined according to an address applied from an exterior during the read operation for outputting data.

Conventionally, the even operation or the odd operation is carried out by means of switches 41, 42, 43 and 44 shown in FIG. 4.

Since 4-bit data (DQ0 to DQ3) are applied, the start address is one of "00", "01", "10" and "11".

The switches 41 and 43 determine whether the start address is even or odd. If the start address is odd (that is, "01" or "11"), data (DQ1 and DQ3) are transferred to the switch 42 and data (DQ0 and DQ2) are transferred to the switch 44.

Data transferred to the switch 42 are sequentially outputted while being synchronized with a rising edge of a clock. In FIG. 4, rdo represents output data synchronized with the rising edge of the clock. Data transferred to the switch 44 are sequentially outputted while being synchronized with a falling edge of a clock. In FIG. 4, fdo represents output data synchronized with the falling edge of the clock.

In a case of FIG. 4, the pipe latch unit includes a plurality of internal switches connected to each other in series. Thus, there is a limitation to increase the data transmission speed even if the repeater is provided in the transmission line.

That is, in the next-generation memory device equipped with various internal circuits for controlling data, such as DDR SDRAM, DDR2, and SDRAM, the data transmission speed may be lowered even if the repeater is provided in the transmission line.

SUMMARY OF THE INVENTION

Accordingly, the present invention has been made to solve the above-mentioned problems occurring in the prior art, and an object of the present invention is to provide a data transmission line structure capable of reducing a coupling effect between transmission lines.

Another object of the present invention is to provide a data transmission line structure capable of improving a data transmission speed by providing a repeater having a data switch function as well as a repeater function in a data transmission line.

Still another object of the present invention is to provide a data transmission line having a repeater and capable of reducing a coupling effect.

In order to accomplish the above objects, according to a first aspect of the present invention, there is provided a data transmission line of a semiconductor memory device, the data transmission line comprising:

a first repeater receiving first and second data and having first and second output lines; a second repeater receiving third and fourth data and having third and fourth output lines;

a first latch switch operated when a start address of a column address applied during a read operation is an even address; and a second latch switch operated when the start address of the column address applied during the read operation is an odd address.

The operations of the first and second repeaters are controlled by means of a control signal determined according to the start address.

The first data are transferred to the first output line, the second data are transferred to the second output line, the third data are transferred to the third output line, the fourth data are transferred to the fourth output line, the first latch switch receives data through the first and third output lines and the second latch switch receives data through the second and fourth output lines when the start address is the even address.

The first data are transferred to the second output line, the second data are transferred to the first output line, the third data are transferred to the fourth output line, the fourth data are transferred to the third output line, the first latch switch receives data through the second and fourth output lines and the second latch switch receives data through the first and third output lines when the start address is the odd address.

According to the preferred embodiment of the present invention, data lines receiving the first to fourth data include first and second lines, which are aligned in different layers from each other.

According to the preferred embodiment of the present invention, a plurality of data transmission lines include first and second lines, which are aligned in different layers from each other.

In order to accomplish the above objects, according to a second aspect of the present invention, there is provided a data transmission line of a semiconductor memory device, the data transmission line comprising:

a first repeater receiving first data through a first data line so as to selectively transmit the first data to a first path corresponding to an even address or a second path corresponding to an odd address;

a second repeater receiving second data through a second data line so as to selectively transmit the second data to the first path corresponding to the even address or the second path corresponding to the odd address; an even control signal generating section for enabling the first path; and an odd control signal generating section for enabling the second path.

In order to accomplish the above objects, according to a third aspect of the present invention, there is provided a data transmission line of a semiconductor memory device, the data transmission line comprising:

a first repeater connected to a first data line and including a first path enabled in response to an even control signal and a second path enabled in response to an odd control signal; and a second repeater connected to a second data line and including a first path enabled in response to the even control signal and a second path enabled in response to the odd control signal, wherein the first and second data lines are aligned in different layers from each other.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

Figure 5:
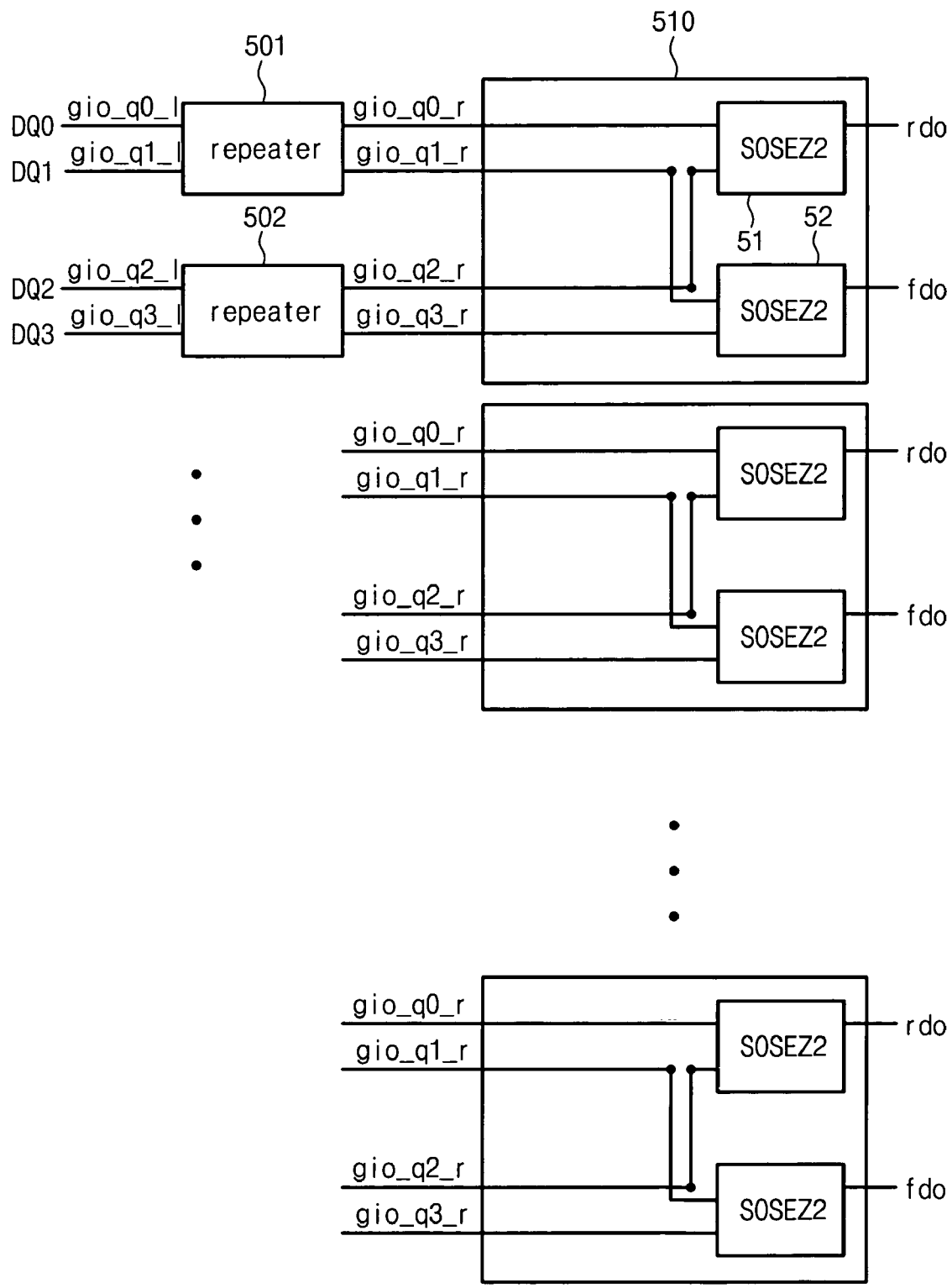
FIG. 5 is a view showing a data transmission line structure having a repeater according to one embodiment of the present invention.

FIG. 5 is a view showing a data transmission line structure having a repeater according to one embodiment of the present invention. The data transmission line structure of the present invention shown in FIG. 5 is adaptable for a memory device having a DDR structure.

Figure 4:
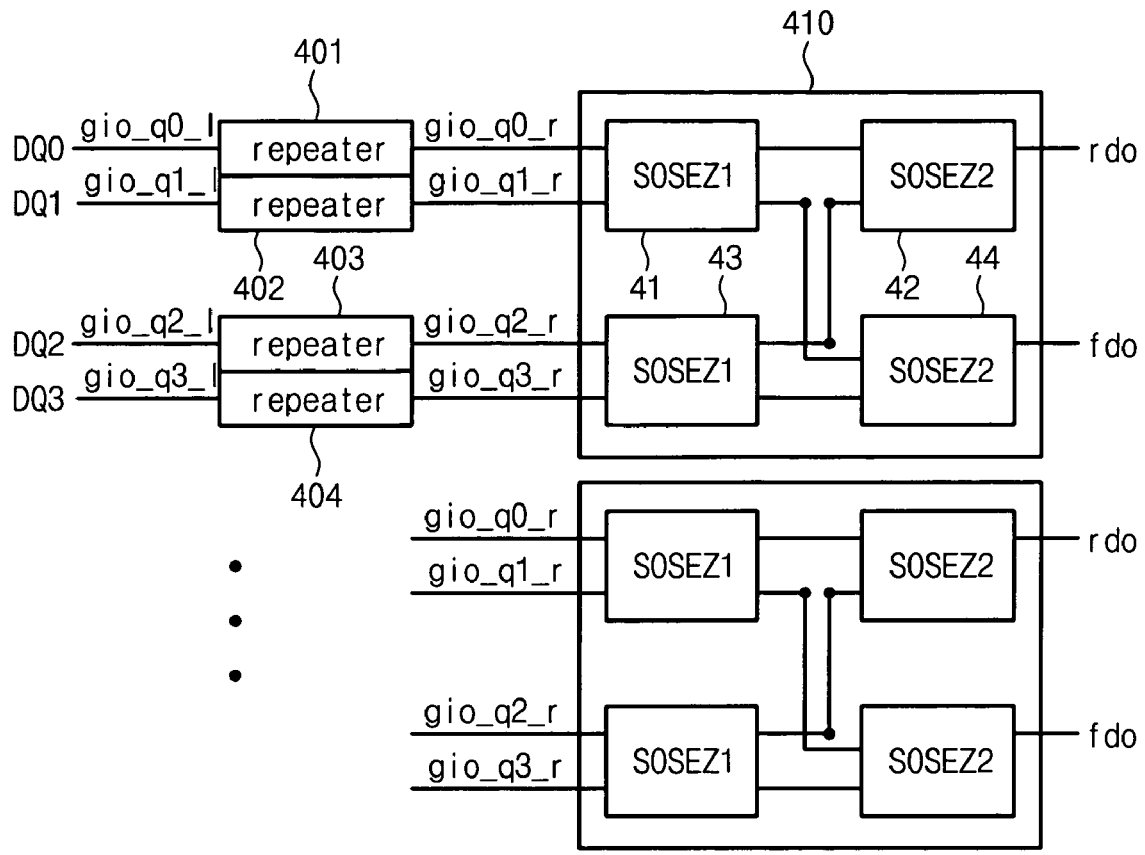
FIG. 4 is a schematic view showing a structure of a data transmission route of a conventional DDR SDRAM transmitting data using a repeater shown in FIG. 3.
Figure 4:
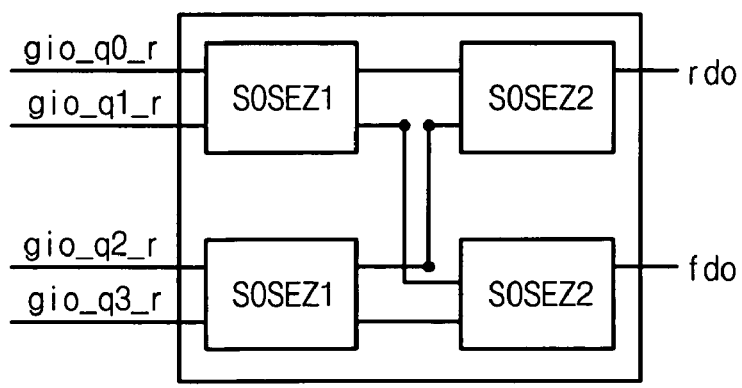

Referring to FIG. 5, repeaters 501 and 502 are connected to a pipe latch unit 510 through data transmission lines (gio_q0_r, gio_q1_r, gio_q2_r, and gio_q3_r). The pipe latch unit 510 includes two latch switches 51 and 52. The latch switches 51 and 52 shown in FIG. 5 have structure identical to structures of switches 42 and 44 shown in FIG. 4. That is, the latch switches 51 and 52 have latch functions.

In short, the repeaters 501 and 502 have a switch function as well as a repeater function. The repeaters 501 and 502 will be described later in detail with reference to FIG. 6.

Since 4-bit data (DQ0-DQ3) are applied, a start address is one of "00", "01", "10" and "11".

If the start address is odd (that is, "01" or "11"), data (DQ1 and DQ3) are transferred to the latch switch 51 and data (DQ0 and DQ2) are transferred to the latch switch 52.

Data transferred to the latch switch 51 are sequentially outputted while being synchronized with a rising edge of a clock. An output signal "rdo" of the pipe latch unit 510 represents data synchronized with the rising edge of the clock. Data transferred to the latch switch 52 are sequentially outputted while being synchronized with a falling edge of a clock. An output signal "fdo" of the pipe latch unit 510 represents data synchronized with the falling edge of the clock.

As is understood from FIG. 5, repeaters 501 and 502 have switch functions. Thus, a data transmission path is shortened so that a higher data transmission speed can be achieved.

Figure 6:
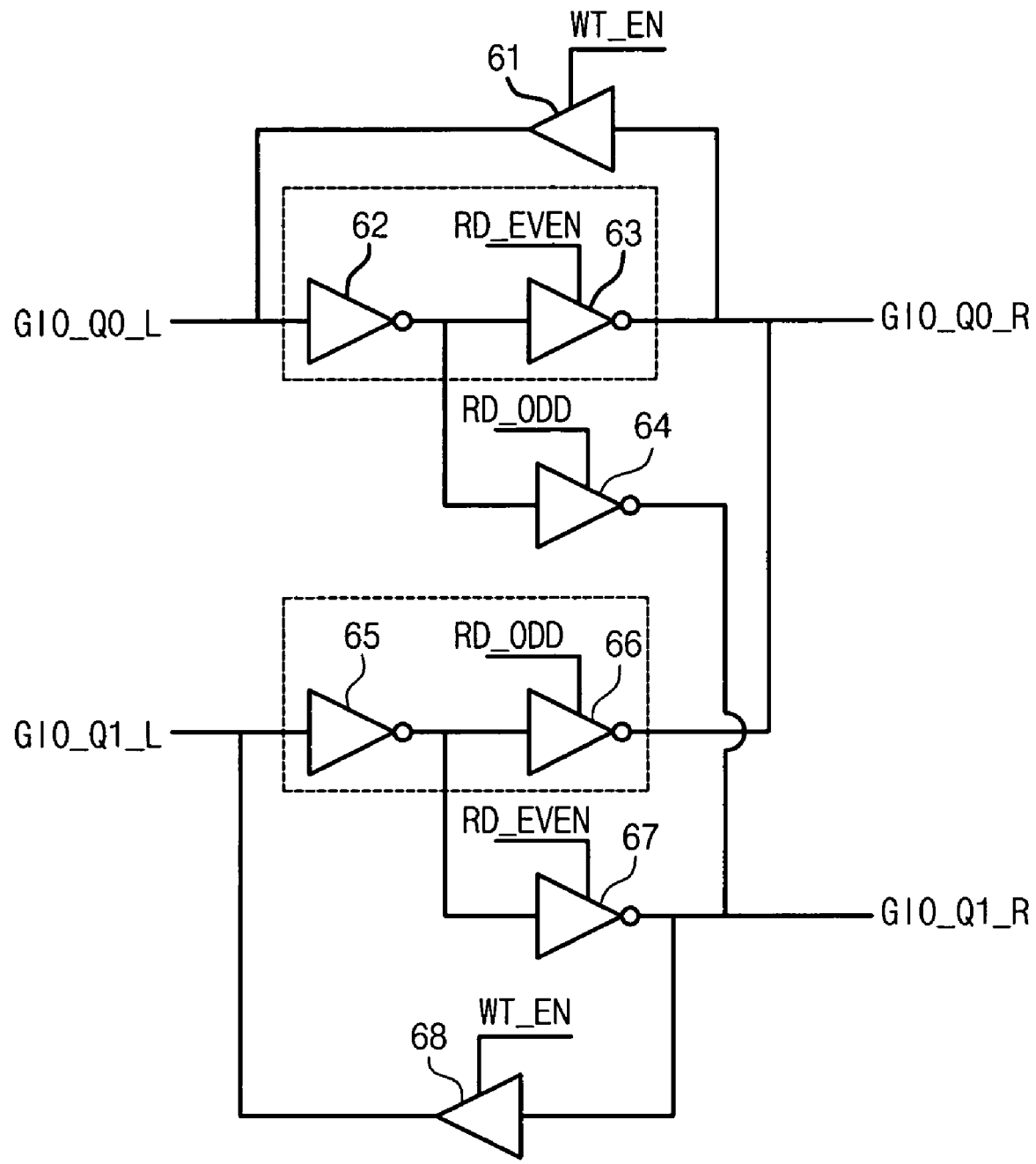
FIG. 6 is a circuit view showing a repeater having a switch function as well as a repeater function according to one embodiment of the present invention.

FIG. 6 is a circuit view showing a repeater having a switch function as well as a repeater function according to one embodiment of the present invention.

Referring to FIG. 6, the repeater of the present invention includes a first repeater connected to a data transmission line GIO_Q0_L and having a first path 63 enabled in response to an even control signal RD_EVEN and a second path 64 enabled in response to an odd control signal RD_ODD and a second repeater connected to a data transmission line GIO_Q1_L and having a first path 67 enabled in response to an even control signal RD_EVEN and a second path 66 enabled in response to an odd control signal RD_ODD.

In FIG. 6, repeaters are positioned between data transmission lines (GIO_Q0_L and GIO_Q1_L) and data transmission lines (GIO_Q0_R and GIO_Q1_R).

When a write operation is carried out, a control signal (WT_EN) is enabled with a high level, and control signals (RD_EVEN and RD_ODD) are disabled with a low level. Accordingly, drivers 61 and 68 become an active state and drivers 63, 64, 66 and 67 become a non-active state. Accordingly, data in the data transmission lines (GIO_Q0_R and GIO_Q1_R) are transferred to the data transmission lines (GIO_Q0_L and GIO_Q1_L) through the drivers 61 and 68.

When a read operation is carried out, a data transmission path may vary depending on a least significant address A0 of the start column address.

For instance, if the least significant address A0 is "0", and first data are applied to the data transmission line (GIO_Q0_L), the control signal (RD_EVEN) becomes a high level and the control signal (RD_ODD) becomes a low level.

Therefore, data applied to the data transmission line (GIO_Q0_L) are transmitted to the data transmission line (GIO_Q0_R) and data applied to the data transmission line (GIO_Q1_L) are transmitted to the data transmission line (GIO_Q1_R).

In contrast, if the least significant address A0 is "0", and first data are applied to the data transmission line (GIO_Q1_L), the control signal (RD_ODD) becomes a high level and the control signal (RD_EVEN) becomes a low level.

Therefore, data applied to the data transmission line (GIO_Q1_L) are transmitted to the data transmission line (GIO_Q0_R) and data applied to the data transmission line (GIO_Q0_L) are transmitted to the data transmission line (GIO_Q1_R).

As can be understood from the circuit structure shown in FIG. 6, the data transmission line of the present invention includes a selection unit for varying transmission paths in match with the even address and the odd address.

Figure 7:
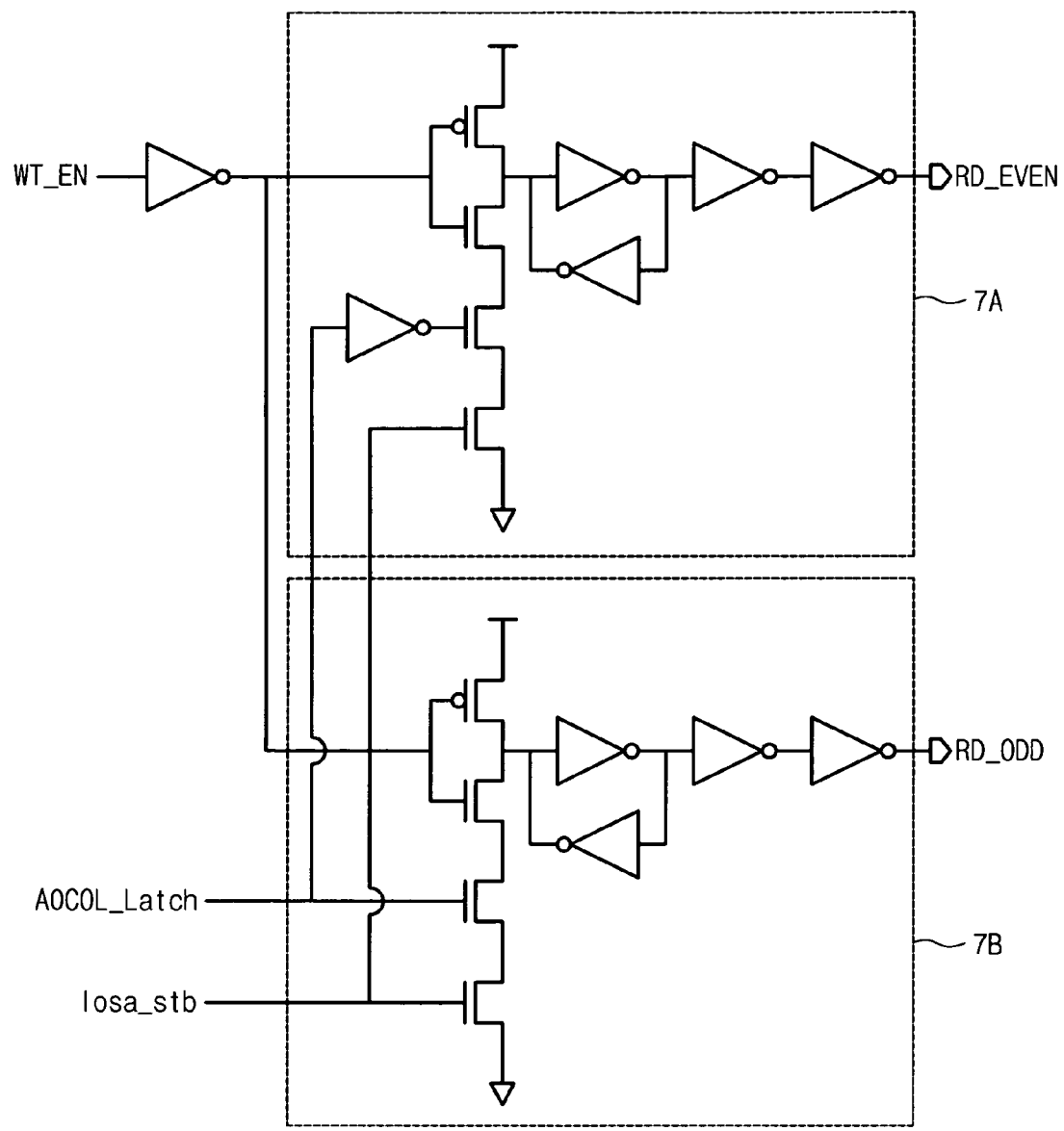
FIG. 7 is a circuit view showing a control signal generating unit, in which the control signal generating unit generates control signals (RD_EVEN and RD_ODD) in order to control an operation of a repeater.

FIG. 7 is a circuit view showing a control signal generating unit, which generates control signals (RD_EVEN and RD_ODD) in order to control an operation of a repeater.

Referring to FIG. 7, the control signal generating unit of the present invention includes an even control signal generating section 7A for generating an even control signal (RD_EVEN) in response to a write control signal (WT_EN), a control signal (A0COL_Latch) and an enable signal (losa_stb), and an odd control signal generating section 7B for generating an odd control signal (RD_ODD) in response to a write control signal (WT_EN), a control signal (A0COL_Latch) and an enable signal (losa_stb).

In FIG. 7, if the enable signal (losa_stb) has a high level, the control signal generating unit may operate. The control signal (A0COL_Latch) signifies a column address signal (A<0>).

During the write operation, the write control signal (WT_EN) becomes a high level. Thus, the control signals (RD_EVEN and RD_ODD) become low levels.

During the read operation, the write control signal (WT_EN) becomes a low level. Thus, if the column address signal (A<0>) is "0", the control signal (RD_EVEN) becomes a high level, so an even data path as shown in FIG. 5 is formed. If the column address signal (A<0>) is "1", the control signal (RD_EVEN) becomes a low level, so an odd data path as shown in FIG. 5 is formed.

Figure 8:
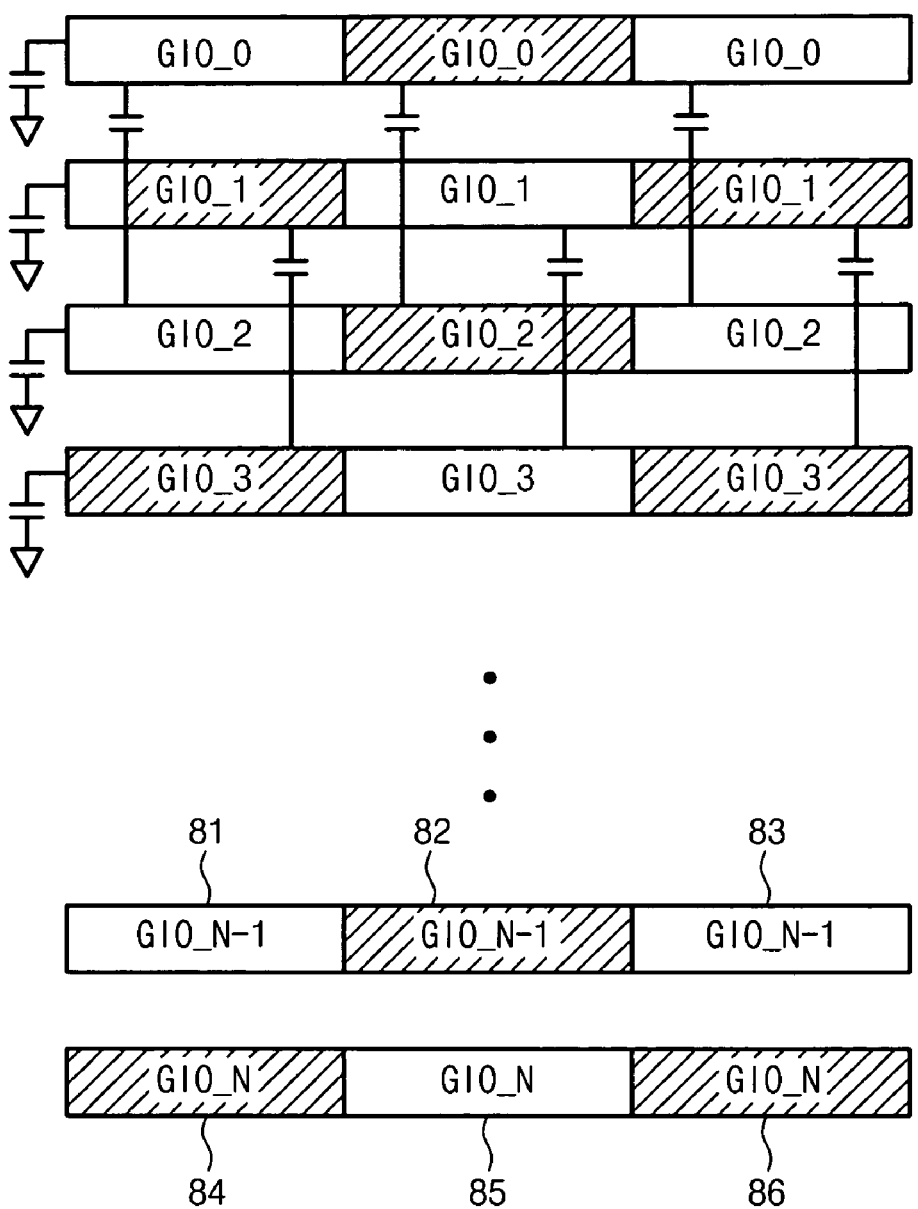
FIG. 8 is a schematic view showing an alignment of data transmission lines (GIO_0 to GIO_N) according to one embodiment of the present invention.
Figure 9:
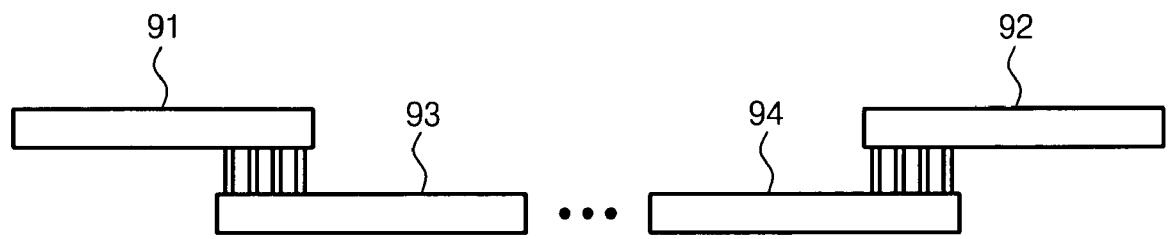
FIG. 9 is a schematic view showing a lateral portion of an alignment of data transmission lines shown in FIG. 8.

FIGS. 8 and 9 are views showing structures of data transmission lines (GIO_0 to GIO_N) according to one embodiment of the present invention.

Figure 1:
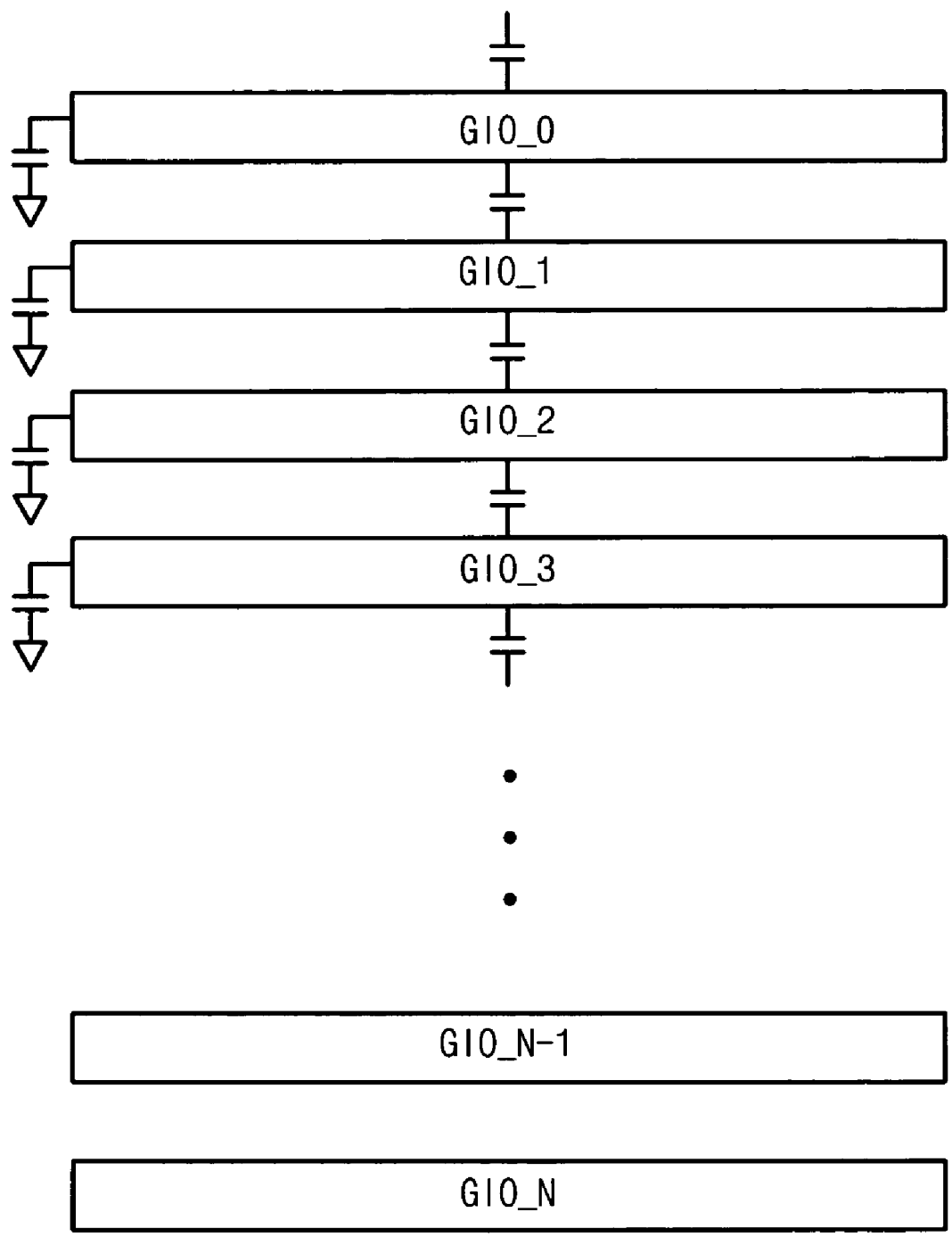
FIG. 1 is a schematic view showing an alignment of conventional data transmission lines (GIO_0 to GIO_N)
Figure 2:
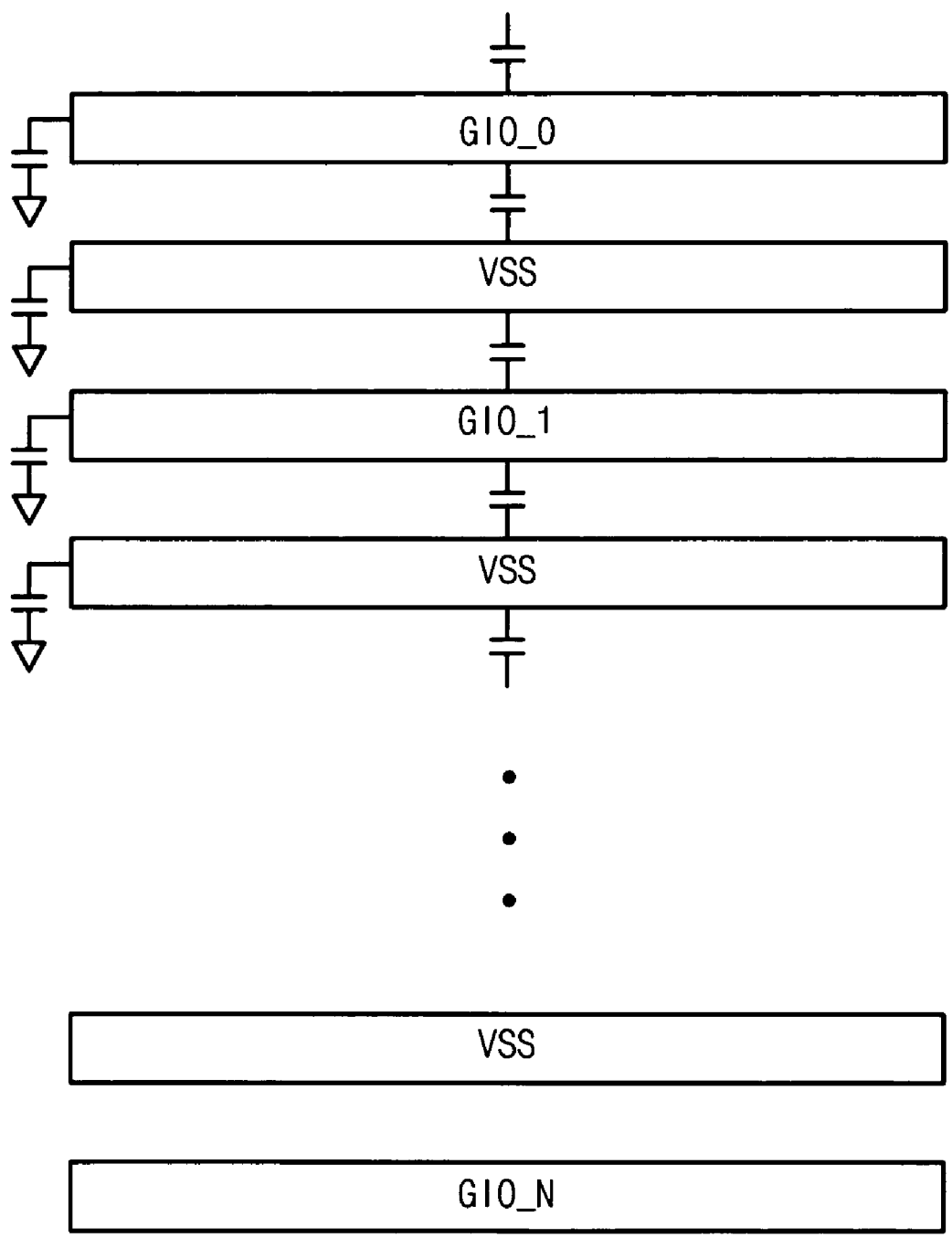
FIG. 2 is a schematic view showing an alignment of another conventional data transmission lines.
Figure 3:
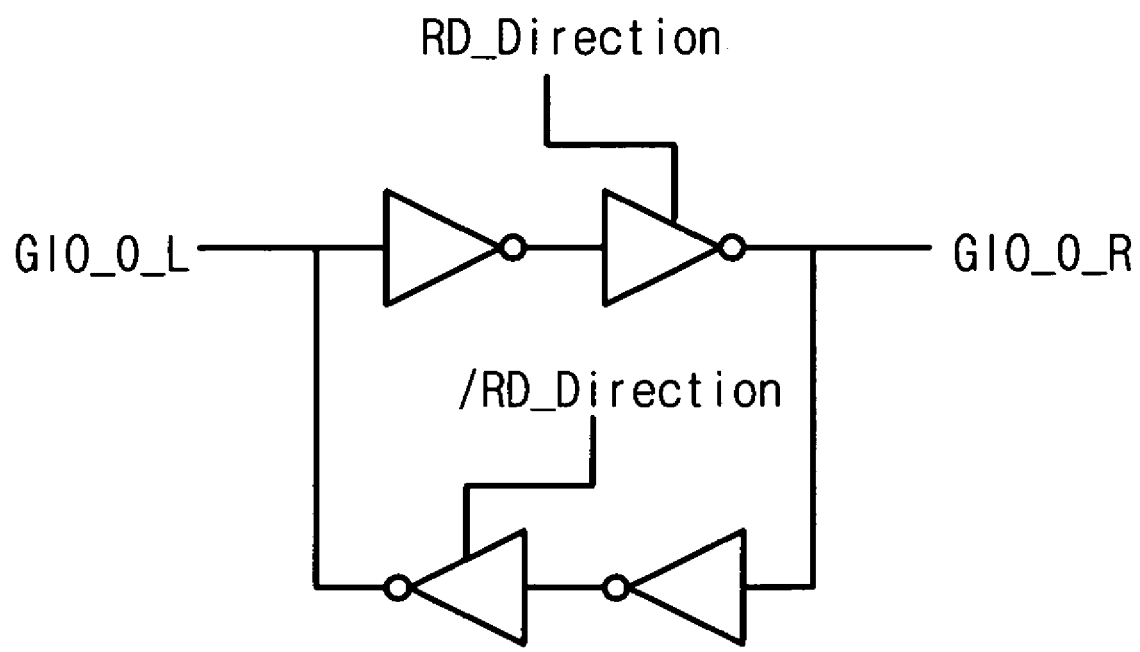
FIG. 3 is a circuit view showing a conventional repeater connected to a data transmission line.
Figure 3:
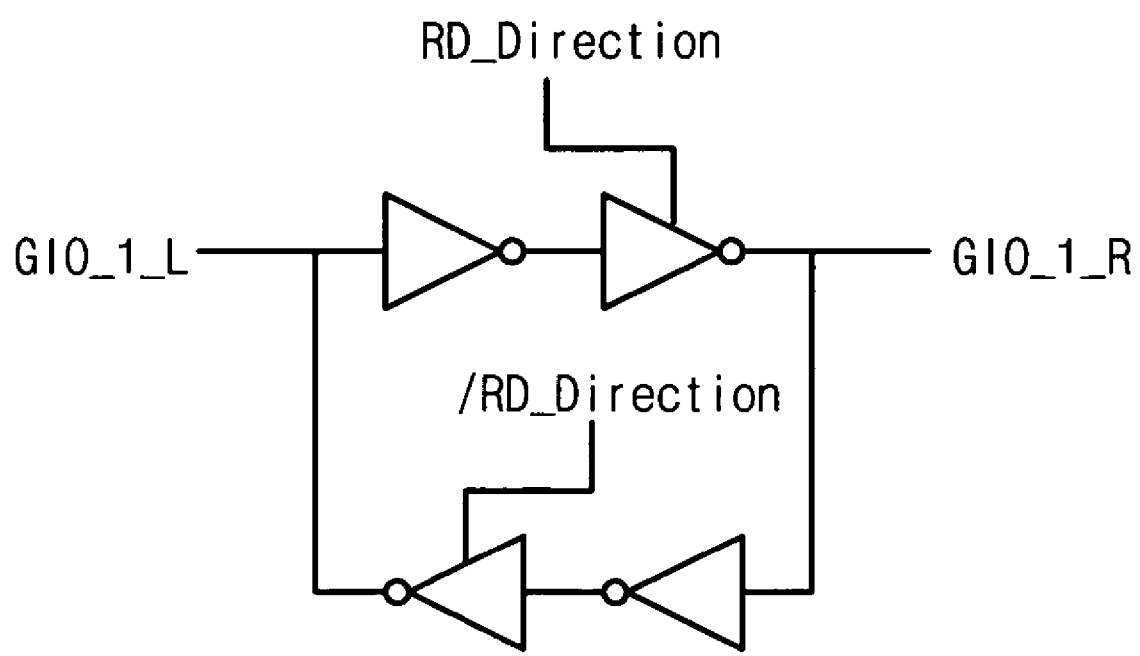

The conventional data transmission lines shown in FIGS. 1 and 2 may cause a delay of data transmission due to parasitic capacitance between data transmission lines. In order to solve this problem, the present invention suggests a data transmission line structure capable of reducing parasitic capacitance between data transmission lines as shown in FIG. 8.

FIG. 9 is a schematic view showing a sectional structure of data transmission lines shown in FIG. 8.

As shown in FIG. 9, a part of the data transmission lines is aligned in a different layer. That is, the data transmission lines are not aligned in the same layer.

Referring to FIGS. 8 and 9, a data transmission line 81 corresponds to a data transmission line 91, a data transmission line 83 corresponds to a data transmission line 92, and a data transmission line 85 corresponds to data transmission lines 93 and 94.

As can be understood from FIGS. 8 and 9, an interval between data transmission lines is enlarged by two times as compared with that of conventional data transmission lines, so that parasitic capacitance can be reduced to ½. Accordingly, the data transmission line structure of the present invention can increase a data transmission speed.

As mentioned above, according to the present invention, control signals related to even data or odd data can be transmitted through the repeater when transmitting data in a DDR DRAM, so the number of transmission units used in the data transmission lines can be reduced, thereby improving the data transmission speed.

Referring to FIGS. 5 to 9, in the data transmission line structure employing the repeater according to the present invention, data lines are aligned in different layers from each other, so that the data transmission speed can be further increased.

As described above, the present invention provides the data transmission line structure having a simple structure and capable of reducing parasitic capacitance between data transmission lines. That is, the data transmission line structure of the present invention includes the repeater having a function of controlling even and odd control signals and the data transmission lines are aligned in different layers. Thus, the data transmission line structure of the present invention can improve the data transmission speed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A data transmission line of a semiconductor memory device, the data transmission line comprising:
   a first repeater receiving first and second data through a first data line and a second data line, respectively, and having first and second output lines;
   a second repeater receiving third and fourth data through a third data line and a fourth data line, respectively, and having third and fourth output lines;
   a first latch switch operated when a start address of a column address applied during a read operation is an even address; and
   a second latch switch operated when the start address of the column address applied during the read operation is an odd address,
   wherein the first repeater is configured to transfer the first data through selected one of the first and second output lines and the second data through non-selected one of the first and second output lines using a control signal determined according to the start address, and
   wherein the second repeater is configured to transfer the third data through selected one of the third and fourth output lines and the fourth data through non-selected one of the third and fourth output lines using the control signal determined according to the start address,
   wherein each of the first to fourth data lines is configured to include at least two portions which are positioned in different planes and the two portions are electrically connected.

2. The data transmission line as claimed in claim 1, wherein the first latch switch sequentially outputs data transmitted thereto while being synchronized with a rising edge of a clock used in a memory device and the second latch switch sequentially outputs data transmitted thereto while being synchronized with a falling edge of the clock used in the memory device.

3. The data transmission line as claimed in claim 1, wherein operations of the first and second repeaters are controlled by means of the control signal determined according to the start address, the first data are transferred to the first output line, the second data are transferred to the second output line, the third data are transferred to the third output line, the fourth data are transferred to the fourth output line, the first latch switch receives data through the first and third output lines and the second latch switch receives data through the second and fourth output lines when the start address is the even address, and
   the first data are transferred to the second output line, the second data are transferred to the first output line, the third data are transferred to the fourth output line, the fourth data are transferred to the third output line, the first latch switch receives data through the second and fourth output lines and the second latch switch receives data through the first and third output lines when the start address is the odd address.

* * * * *